United States Patent
Jahn et al.

(10) Patent No.: US 6,320,747 B1
(45) Date of Patent: Nov. 20, 2001

(54) METHOD FOR MANUFACTURING ELECTRIC MODULES, AND THE ELECTRIC MODULE

(75) Inventors: Hans-Peter Jahn, Pliezhausen; Stephan Ernst, Stuttgart; Volker Brielmann, Waiblingen, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/424,810

(22) PCT Filed: Mar. 26, 1998

(86) PCT No.: PCT/DE98/00883

§ 371 Date: Jan. 31, 2000

§ 102(e) Date: Jan. 31, 2000

(87) PCT Pub. No.: WO98/54760

PCT Pub. Date: Dec. 3, 1998

(30) Foreign Application Priority Data

May 28, 1997 (DE) .............................................. 197 22 355

(51) Int. Cl.[7] ...................................................... H05K 7/20
(52) U.S. Cl. .......................... 361/704; 361/723; 361/756; 257/719; 29/877
(58) Field of Search ..................................... 361/702–710, 361/721–728, 732–736, 748–752, 760–765, 772–774, 777, 778, 730, 717–719; 257/678, 683, 686, 689, 679, 690–698, 607, 706–727, 666, 687, 692, 701; 174/52.1, 52.2, 252, 256, 16.3, 52.4; 165/80.3, 185

(56) References Cited

U.S. PATENT DOCUMENTS

| | | | |
|---|---|---|---|
| 4,639,759 | * | 1/1987 | Neidig ...................................... 357/74 |
| 4,731,644 | * | 3/1988 | Neidig ...................................... 357/72 |
| 5,250,843 | * | 10/1993 | Eichelberger ........................ 257/692 |
| 5,291,065 | * | 3/1994 | Arai et al. ............................. 257/723 |
| 5,362,926 | * | 11/1994 | Fukuda et al. ........................ 174/256 |
| 5,408,128 | * | 4/1995 | Furnival ................................ 257/690 |
| 5,430,330 | * | 7/1995 | Takahama et al. ................... 257/788 |
| 5,463,251 | * | 10/1995 | Fujita et al. .......................... 257/717 |
| 5,521,437 | * | 5/1996 | Oshima et al. ....................... 257/701 |
| 5,536,972 | * | 7/1996 | Kato ...................................... 257/706 |
| 5,616,955 | * | 4/1997 | Yamada et al. ...................... 257/690 |
| 5,629,838 | * | 5/1997 | Knight et al. ......................... 361/782 |
| 5,646,445 | * | 7/1997 | Masumoto et al. .................. 257/723 |
| 5,744,860 | * | 4/1998 | Bayerer ................................ 257/683 |
| 5,920,119 | * | 7/1999 | Tamba .................................. 257/706 |
| 5,942,797 | * | 8/1999 | Terasawa ............................. 257/723 |

\* cited by examiner

*Primary Examiner*—Leo P. Picard
*Assistant Examiner*—Michael Datskovsky
(74) *Attorney, Agent, or Firm*—Kenyon & Kenyon

(57) ABSTRACT

A method is described for producing electric modules, where a power module is attached to a fastening part with an adhesive, with the adhesive first being precured in an edge area, and in another step the power module is encased in a gel. In another step, the gel and the adhesive are fully cured together in one step. This method is cost- and time-optimized for producing a compact electric module with power modules that have a high power loss and are exposed to high mechanical stresses.

16 Claims, 1 Drawing Sheet

METHOD FOR MANUFACTURING ELECTRIC MODULES, AND THE ELECTRIC MODULE

BACKGROUND INFORMATION

Convention method and electric module are described in German Patent Application No. 39 39 628, where the components are glued to ceramic film circuits with a UV curing adhesive or adhesive resin (abbreviated "adhesive") and the adhesive is cured by irradiating the rear side of the ceramic film circuits with UV light. Curing of the adhesive beneath the entire component is induced by the UV light fraction passing through the substrate.

SUMMARY OF THE INVENTION

A method according to the present invention has the advantage that after precuring of the independent method claim, however, has the advantage that after precuring of the adhesive, the component or a power module can be encased in a gel in another step, and the gel and the adhesive can be fully cured together in one step in a furnace operation after the gelation process. This means considerable time savings in comparison with two separate furnace steps for the adhesive and the gel. It can be regarded as an advantage of the electric module that it has a compact design which guarantees reliable contacting and cooling of the components arranged on the power module.

Edge curing of the adhesive in an edge area of the power module, in particular with UV irradiation, is also advantageous. Therefore, only a small, freely accessible area is necessary for the curing radiation, and the precuring process with UV light requires only a few seconds, so it leads to great time savings in comparison with curing in a furnace process.

Precuring of the adhesive in conjunction with a power module bonding operation has proven to be extremely advantageous. Precuring yields adequate initial bonding of the power module to a fastening part to permit fault-free contacting of the power module in an automated bonding operation. In other words, precuring guarantees adequate fixation of the power module for wire bonding as well as saving a great deal of time in curing the adhesive and the gel used for encasing the power module.

The power module is made ready in an advantageous manner by using a metal conductor frame made of copper in particular, applied to the chip with an electrically conductive adhesive in an electrically conducting bond, for example. Here again, it is possible when curing the adhesive to eliminate a furnace process, which would otherwise be time consuming and tedious in mass production, if the electrically conducting adhesive escaping at the side of the chip is also cured with UV radiation or if, in order to produce an electric connection between the power module and the metallic block, the adhesive is heated in an induction furnace to cure it, i.e., in a furnace where a suitable heating is achieved by eddy currents induced by magnetic induction.

DETAILED DESCRIPTION

Figure 1:
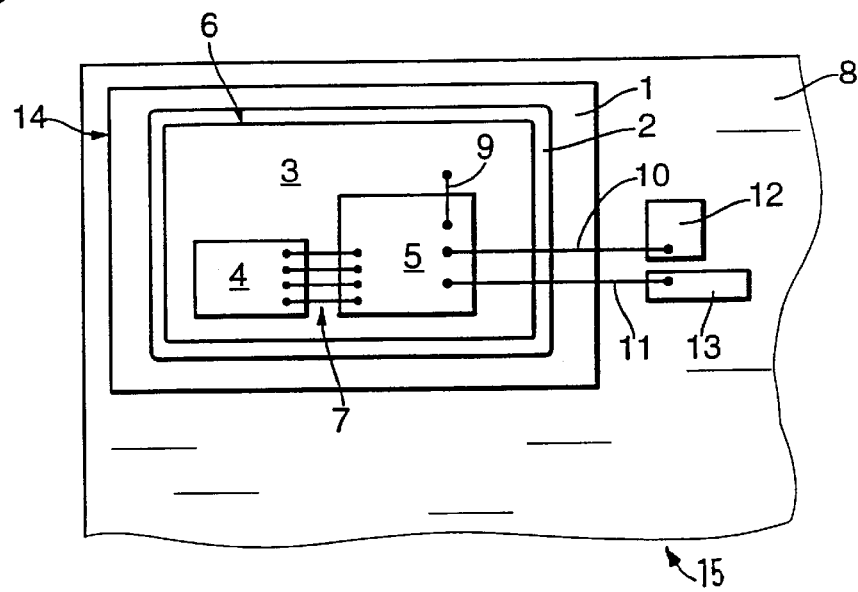
FIG. 1 shows a top view of an electric module produced by a method according to the present invention.

FIG. 1 shows a power module 6 arranged on a fastening part 1 designed as a heat sink. Power module 6 has a bottom piece designed as a copper block 3 with one chip 4 and another chip 5 arranged on it. The two chips are electrically interconnected by wire bonds 7. Heat sink 1 is connected to a plastic casing 8, a detail of which is shown in FIG. 1. A narrow edge of heat sink 1 can also be seen in recess 14 of electric module 15. The adhesive arranged between copper block 3 and heat sink 1 is slightly visible beneath copper block 3, i.e., copper block 3 is surrounded in a narrow edge area by an edge area of adhesive layer 2. The chips may be connected electrically to the nickel-plated surface of copper block 3 by wire bonds 9, for example; likewise, in the embodiment illustrated, in FIG. 1 chip 5 is electrically connected to contact faces 12 and 13 by wire bonds 10 and 11; these contact faces may be arranged in the plastic casing and may lead, either inside the plastic casing or on its surface, to contact points of the electric module, e.g., to holes which also function to secure the electric module mechanically.

Figure 2:
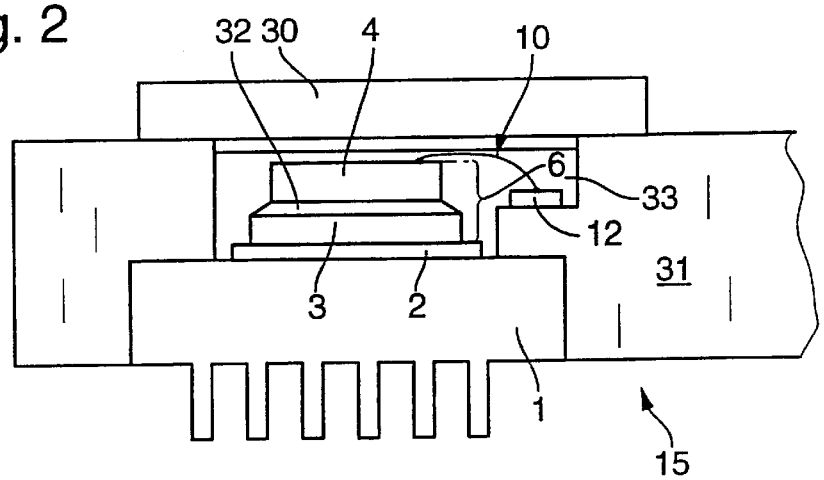
FIG. 2 shows a cross-sectional view of the electric module illustrated in FIG. 1.

FIG. 2 shows a side view of a cross section of the electric module shown in FIG. 1. The same reference notation as used in FIG. 1 is used here for the same parts and will not be described again. In the embodiment illustrated, the back of the heat sink is provided with cooling ribs, while on the front of the heat sink the power module arranged on the heat sink is surrounded with a gel 33 for the purpose of preventing corrosion. This gel also surrounds contact faces 12, for example. Plastic casing 8 surrounds the arrangement of heat sink and power module, with heat sink 1 being joined in a form-fitting manner to plastic casing 8. The cross section here shows the electrically conducting connection of chip 4 to copper block 3 by an additional adhesive 32 which is electrically conductive. Electric module 15 is also provided with a cover 30 which protects the area provided with a gel around the power module from mechanical damage, for example.

Electric module 15 functions to charge an automotive battery, for example, to a charge which depends on the charge state of the battery, by using a generator driven by an automotive engine. The module is then exposed to harmful environmental influences and has a high power loss, so that both reliable mechanical protection and corrosion protection as well as good dissipation of the power loss must be provided and yet the design must be as compact as possible. The heat sink and the adequately heat-conducting connection via copper block 3 and the adequately heat-conducting adhesive 2 guarantee reliable dissipation of the power loss, the gel arranged around the power module provides protection from corrosion, and the cover and plastic casing 8 together with the contact points guarantee protection from mechanical damage and a sturdy mechanical and electric connection of the module to other devices.

Figure 3:
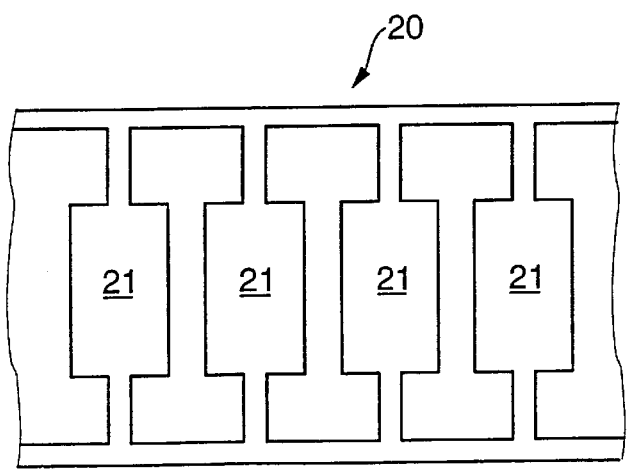
FIG. 3 shows a design of a conductor frame used in the method according to the present invention.

A method of producing an electric module illustrated in FIGS. 1 and 2 is described below. First, a conductor frame 20 shown in to FIG. 3 is provided, preferably being made of copper and having copper blocks 21 which later form bottom part 3 of a power module 6. An electrically conductive adhesive is applied with a stamp to copper blocks 21 of conductor frame 20 to establish an electrically conducting connection (ground connection) between chip and copper block. In another step, the chips are arranged on the surfaces provided with the electrically conductive adhesive and the adhesive is cured. This is done in a furnace operation and lasts for approx. 2½ hours. Solder which melts in the furnace operation and thus establishes an electric connection between chip and copper block may optionally be introduced between the chips and the copper blocks for mechanical fixation and electric contacting of the chips with the copper blocks. In an advantageous embodiment of the present invention, the presence of a metallic adhesive partner, namely the copper blocks and the electrically conductive adhesive containing metal particles, is utilized to achieve curing of the adhesive (or melting of the solder arranged between the chips and the copper blocks) by magnetic induction in an induction furnace instead of a complicated furnace operation (time consuming and taking up space). As an alternative, here again the chips may be secured by partial UV curing of the edge of a conductive adhesive which escapes somewhat at the sides. The prerequisite for this is the use of a UV-curing conductive adhesive. Complete curing of the UV-curing electrically conducting adhesive is accomplished in another step together with the casting gel. The process steps described above are part of preassembly of the power modules. In addition to whole chips, it is also possible to mount individual transistors, diodes, triggering chips or regulator chips on a heat sink, in particular a metallic heat sink. The adhesive may be applied to the conductor frame by stamping, dispensing, screen printing or stencil printing. The use of an induction furnace or a continuous UV pass-through zone leads to a definite shortening of the curing time of the electrically conductive adhesive and to a serial sequence of bonding without a buffer or stack, because the induction furnace can be designed simply as a furnace with continuous flow through of power modules to be cured. The cost of the above-described processes is lower in comparison with a traditional furnace operation with regard to energy and acquisition, because in particular there is no heat loss and only those elements (metallic elements) which are supposed to be heated are heated. Furthermore, the handling of the parts is simplified on the whole. The induction furnace has a continuous flow-through zone with magnetic coils. In addition to a shortened curing time, the warm-up phase of the conductor frame is greatly reduced by the use of magnetic radiation, because specifically metallic parts are heated. The conductor frame illustrated in FIG. 3 thus passes through the continuous flow-through zone of an induction furnace or a UV irradiation installation, and this procedure permits integration of the aforementioned power module preassembly into the manufacturing process of the final assembly of the electric module described below. This yields as potential savings lower investment costs (one less furnace) and minimization of manufacturing time per conductor frame plus low energy costs.

Final assembly comes after the preassembly of the power modules described above. The power modules are separated by punching out conductor frame 20, and wire bonding is optionally performed in a bond assembly, i.e., the various electric connections are established among multiple chips 4, 5 arranged on a bottom piece 3 designed as a copper block 21. Power module 6 must then be attached to heat sink 1. This connection is implemented by a heat conducting adhesive. Adhesive is applied to the heat sink by stamping, dispensing or screen or stencil printing. Then the power module is applied to adhesive layer 2. In another step, adhesive layer 2 formed by a UV-curing adhesive in an edge area around power module 6 is precured, as shown in FIG. 1, where it is labeled with reference number 2. This edge crosslinking is performed by radiation curing with UV light at a wavelength of 10 to 400 nm, preferably at 300 to 400 nm, directed from above onto the power module in the view according to FIG. 1. Only this edge area of the adhesive layer of the UV-curing adhesive is crosslinked. This step takes approx. 15 seconds. This precuring is sufficient to guarantee the mechanical stability required for a subsequent wire bonding operation. In this wire bonding operation, the chips arranged on the copper block are electrically connected to contact faces 12, 13 and/or to the copper block by wire bonds 9, 10, 11 for example by ultrasonic welding. The UV-curing adhesive used is, for example, a UV-curing acrylate adhesive. Such a UV-curing acrylate adhesive is available, for example, under the brand name Vitralit 850/7 from the company Panacol. Spacers can be used to advantage here to guarantee a minimum thickness of adhesive layer 2, which is necessary to compensate for mechanical stresses. In another step, the power module and the wire bonds are cast in a gelling process where the power modules and the wire bonds are encased in a gel. Then residual curing of adhesive layer 2 beneath the power module (and optionally adhesive layer 32) is performed, and the silicone gel used for the gelling process is cured in one operation in a furnace step. In the past, a heat-conducting adhesive which binds only through the influence of heat has been used for bonding a power module to a heat sink. Therefore, a furnace step had to be used between assembly of the heat sink with a power module and the wire bonding, because mechanical securing of the power module is necessary for wire bonding. In the method according to the present invention, however, instead of two separate furnace steps for adhesive curing and gel curing, each taking approx. 1½ to 2 hours, only one common furnace step is necessary, whereas precuring of adhesive layer 2 is performed in a UV-precuring step lasting 15–30 seconds, where the edge area of adhesive layer 2 is irradiated. In addition to the elimination of one furnace operation, it is possible to design the precuring operation as a continuous flow-through zone where modules with adhesive layers to be precured pass through a zone filled with UV light continuously for a defined period of time, starting from the preceding process step, then seamlessly entering the downstream process step of wire bonding. Since the IC is wire bonded, although the adhesive beneath the power module has not yet fully cured, the process of wire bonding here is also known as wet bonding. The advantages of the method of mechanical prefixation of the power module by initial edge curing of the UV-curing adhesive include considerable cost savings, because it is not necessary to acquire a second expensive furnace, and energy costs are reduced approximately to one half the energy required for full curing. Time savings of 1½ to 2½ hours due to the fact that only one furnace step is required are also especially advantageous.

The use of an induction furnace or UV edge curing of a conductive adhesive as described in conjunction with preassembly of the power modules is also conceivable when chips are bonded directly to a heat sink, which is surrounded by a plastic casing as shown in FIGS. 1 and 2. The advantage here is that only the metal is heated but the plastic is not. Consequently, only the thermal mass of the metal but not that of the plastic need be heated. This also yields a definite shortening of the warm-up time and thus the total curing time. The prerequisite for the use of an induction furnace is only that one of the adhesive partners must have a high metal content so that heating can be accomplished by induction currents in a controlled manner. Additional applications of an induction furnace could include the assembly of power transistors and diodes in combined soldering and gluing operations, i.e., solder bonding or assembly of power modules on aluminum or iron heat sinks.

What is claimed is:

1. A method for producing an electric module, comprising the steps of:

a) preparing a power module having a metallic bottom piece;

b) preparing a fastening part;

c) applying an adhesive to a particular side of the fastening part;

d) arranging the metallic bottom piece on the adhesive so that the adhesive forms an edge area around the power module;

e) pre-curing the edge area by irradiating the edge area with a UV light, the UV light being directed onto the adhesive from the particular side of the fastening part;

f) encasing the power module in a gel; and g) fully curing the gel and the adhesive together.

2. The method according to claim 1, further comprising the step of:

h) after step (e), wire bonding the power module.

3. The method according to claim 2, wherein step (h) includes the substep of ultrasonic wire bonding the power module.

4. The method according to claim 1, wherein step (a) includes the substeps of:

I. preparing a conductor frame and chips,

II. introducing a bonding medium between the chips and the conductor frame,

III. converting the bonding medium to at least partially bond the chips and the conductor frame, and IV. separating the power modules.

5. The method according to claim 4, wherein step (a) further includes the substep of:

V. wire bonding the chips which are arranged on the power module.

6. The method according to claim 4, wherein the bonding medium is at least one of a further adhesive and a solder.

7. The method according to claim 11, further comprising the step of:

i) converting the bonding medium into an at least partially bonding state by one of UV irradiating the bonding medium and heating the bonding medium in an induction furnace.

8. The method according to claim 1, wherein the fastening part includes a heat sink.

9. The method according to claim 8, further comprising the step of:

j) joining the heat sink to a plastic housing.

10. The method according to claim 8, further comprising the step of:

k) placing a cover on the electric module.

11. An electric module, comprising:

a fastening part;

a power module glued to the fastening part; and a casing joined to the power module, wherein the casing is attached to the power module by bond wires and contact faces, and wherein the power module is package with a gel.

12. The electric module according to claim 11, wherein the casing is composed of a plastic material.

13. The electric module according to claim 11, wherein the power module includes one of a chip, a transistor and a further electronic component.

14. The electric module according to claim 11, wherein the power module includes an arrangement having chips on a bottom piece of the arrangement.

15. The electric module according to claim 14, wherein the bottom piece is composed of a metallic block.

16. The electric module according to claim 14, wherein the metallic block is a copper block.

* * * * *

UNITED STATES PATENT AND TRADEMARK OFFICE
CERTIFICATE OF CORRECTION

PATENT NO. : 6,320,747 B1
DATED : November 20, 2001
INVENTOR(S) : Hans-Peter Jahn et al.

It is certified that error appears in the above-identified patent and that said Letters Patent is hereby corrected as shown below:

Column 1,
Line 17, delete "precuring of the independent method of claim, however, has the advantage that after"

Column 2,
Line 54, delete "to"

Column 6,
Line 17, change "casingjoined" to -- casing joined --

Signed and Sealed this

Third Day of December, 2002

JAMES E. ROGAN
*Director of the United States Patent and Trademark Office*